United States Patent
Zundel

(10) Patent No.: US 9,431,394 B2
(45) Date of Patent: Aug. 30, 2016

(54) POWER SEMICONDUCTOR PACKAGE WITH GATE AND FIELD ELECTRODE LEADS

(71) Applicant: Infineon Technologies AG, Neubiberg (DE)

(72) Inventor: Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 57 days.

(21) Appl. No.: 14/013,804

(22) Filed: Aug. 29, 2013

(65) Prior Publication Data

US 2015/0061003 A1 Mar. 5, 2015

(51) Int. Cl.
  *H01L 23/31* (2006.01)
  *H01L 23/00* (2006.01)
  *H01L 27/088* (2006.01)
  *H01L 23/495* (2006.01)

(Continued)

(52) U.S. Cl.
  CPC ....... *H01L 27/088* (2013.01); *H01L 23/49524* (2013.01); *H01L 23/49562* (2013.01); *H01L 24/40* (2013.01); *H01L 29/407* (2013.01); *H01L 29/7397* (2013.01); *H01L 29/7813* (2013.01); *H01L 23/3121* (2013.01); *H01L 24/06* (2013.01); *H01L 24/29* (2013.01); *H01L 24/32* (2013.01); *H01L 24/48* (2013.01); *H01L 24/49* (2013.01); *H01L 24/73* (2013.01); *H01L 29/404* (2013.01); *H01L 29/41766* (2013.01); *H01L 2224/04042* (2013.01); *H01L 2224/0603* (2013.01); *H01L 2224/291* (2013.01); *H01L 2224/32245* (2013.01); *H01L 2224/37147* (2013.01); *H01L 2224/40247* (2013.01); *H01L 2224/48091* (2013.01); *H01L 2224/48247* (2013.01); *H01L 2224/4903* (2013.01); *H01L 2224/49175* (2013.01); *H01L 2224/73263* (2013.01); *H01L 2224/73265* (2013.01); *H01L 2924/12036* (2013.01); *H01L 2924/1306* (2013.01); *H01L2924/13055* (2013.01); *H01L 2924/13091* (2013.01); *H01L 2924/181* (2013.01)

(58) Field of Classification Search
  CPC ...... H01L 23/31; H01L 27/088; H01L 24/06
  See application file for complete search history.

(56) References Cited

U.S. PATENT DOCUMENTS

| | | | | |
|---|---|---|---|---|
| 5,530,284 A | * | 6/1996 | Bailey | H01L 23/49562 257/666 |
| 7,838,980 B1 | * | 11/2010 | Lee | H01L 23/49551 257/692 |

(Continued)

FOREIGN PATENT DOCUMENTS

| | | |
|---|---|---|
| DE | 102006062011 A1 | 7/2008 |
| DE | 102008063208 A1 | 7/2009 |

*Primary Examiner* — Thanh V Pham
(74) *Attorney, Agent, or Firm* — Murphy, Bilak & Homiller, PLLC

(57) ABSTRACT

A power semiconductor package includes a housing, a semiconductor chip embedded in the housing, and at least four terminals partially embedded in the housing and partially exposed to the outside of the housing. The semiconductor chip includes a first doping region in ohmic contact with a first metal layer, a second doping region in ohmic contact with a second metal layer, and a plurality of first trenches that includes gate electrodes and first field electrodes electrically insulated from the gate electrodes. A first terminal of the four terminals is electrically connected to the first metal layer, a second terminal of the four terminals is electrically connected to the second metal layer, a third terminal of the four terminals is electrically connected to the gate electrodes of the first trenches, and a fourth terminal of the four terminals is electrically connected to the first field electrodes of the first trenches.

22 Claims, 5 Drawing Sheets

(51) Int. Cl.
 *H01L 29/78* (2006.01)
 *H01L 29/739* (2006.01)
 *H01L 29/40* (2006.01)
 *H01L 29/417* (2006.01)

(56) References Cited

U.S. PATENT DOCUMENTS

| | | |
|---|---|---|
| 8,030,703 B2 | 10/2011 | Kotz et al. |
| 8,274,109 B2 | 9/2012 | Zundel |
| 8,586,480 B1 * | 11/2013 | Zommer ............... H01L 24/34 438/119 |
| 2001/0018235 A1 * | 8/2001 | Choi ................. H01L 23/3121 438/122 |
| 2006/0214221 A1 * | 9/2006 | Challa et al. ............... 257/328 |
| 2008/0211019 A1 | 9/2008 | Kotz et al. |
| 2009/0166720 A1 | 7/2009 | Zundel |
| 2010/0001291 A1 * | 1/2010 | Otremba et al. ............. 257/77 |
| 2011/0241170 A1 * | 10/2011 | Haeberlen et al. .......... 257/532 |
| 2012/0319761 A1 | 12/2012 | Zundel |

* cited by examiner

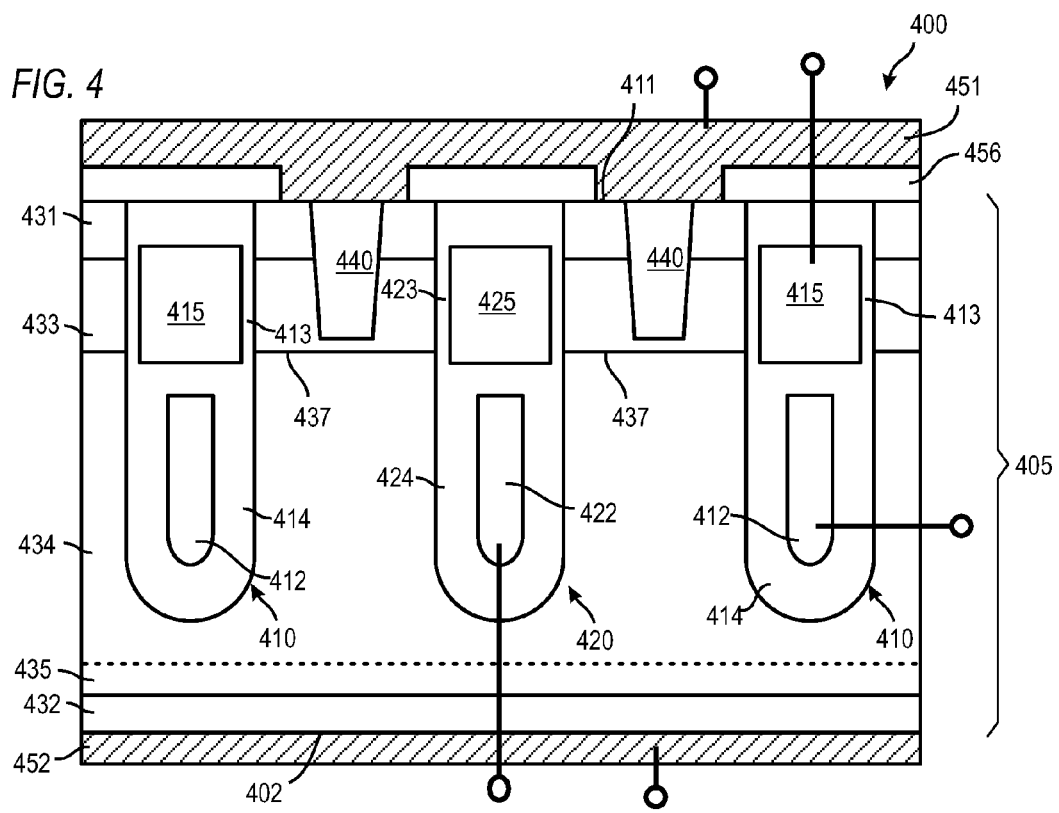
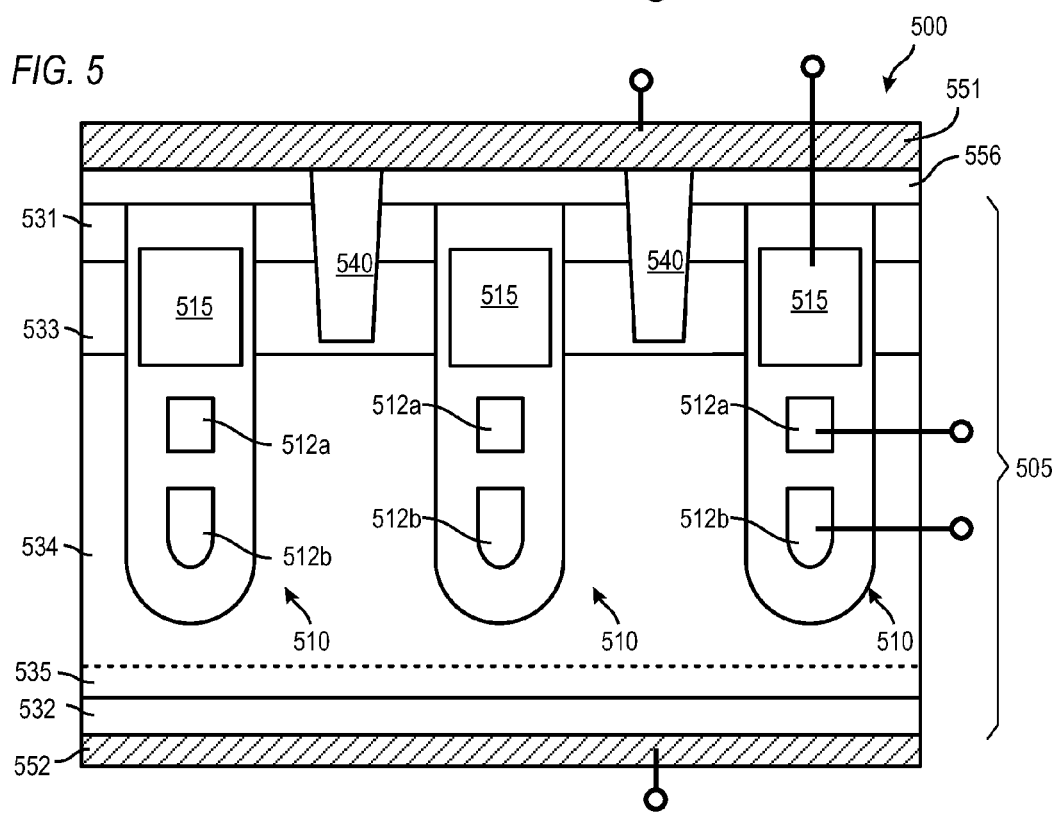

POWER SEMICONDUCTOR PACKAGE WITH GATE AND FIELD ELECTRODE LEADS

TECHNICAL FIELD

Embodiments described herein relate to power semiconductor packages having at least four terminals.

BACKGROUND

Current power semiconductor devices such as MOSFETs are designed to have a low on-state resistance, which is often referred to as R(DS)on. Different approaches have been suggested to reduce R(DS)on. Examples are compensation devices such as superjunction devices and devices having gate and field electrodes in trenches. The field electrodes are typically clamped to source potential to improve depletion of the drift region between adjacent trenches.

SUMMARY

According to an embodiment, a power semiconductor package includes a housing, a semiconductor chip at least partially embedded in the housing, and at least four terminals partially embedded in the housing and partially exposed to the outside of the housing. The semiconductor chip includes a first doping region in ohmic contact with a first metal layer, a second doping region in ohmic contact with a second metal layer, and at least a plurality of first trenches formed in the semiconductor chip, wherein the first trenches includes gate electrodes and at least first field electrodes electrically insulated from the gate electrodes. A first terminal of the at least four terminals is electrically connected to the first metal layer, a second terminal of the at least four terminals is electrically connected to the second metal layer, a third terminal of the at least four terminals is electrically connected to the gate electrodes of the first trenches, and a fourth terminal of the at least four terminals is electrically connected to the first field electrodes of the first trenches.

According to an embodiment, a power semiconductor package includes a housing, a semiconductor chip embedded in the housing, and at least four terminals partially embedded in the housing and partially exposed to the outside of the housing. The semiconductor chip includes a first doping region in ohmic contact with a first metal layer arranged on a first side of the semiconductor chip, a second doping region in ohmic contact with a second metal layer arranged on a second side of the semiconductor chip arranged opposite the first side, and a plurality of trenches formed in the semiconductor chip, wherein the trenches include gate electrodes and at least first field electrodes electrically insulated from the gate electrodes. A first terminal of the at least four terminals is electrically connected to the first metal layer, a second terminal of the at least four terminals is electrically connected to the second metal layer, a third terminal of the at least four terminals is electrically connected to the gate electrodes of the trenches, and a fourth terminal of the at least four terminals is electrically connected to the first field electrode of every nth numbered trench of the trenches, and electrically insulated from the first field electrodes of the other trenches, wherein n is equal to or larger than 2.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis is placed upon illustrating the principles of the embodiments discussed herein. Moreover, in the figures, like reference numerals designate corresponding parts.

FIG. 4 illustrates a semiconductor chip embedded in a power semiconductor package according to an embodiment.

FIG. 5 illustrates a semiconductor chip embedded in a power semiconductor package according to a further embodiment.

DETAILED DESCRIPTION

In the following detailed description, reference is made to the accompanying drawings, which form a part hereof, and in which are shown by way of illustration specific embodiments in which the invention may be practiced. In this regard, directional terminology, such as "top," "bottom," "front," "back," leading," "trailing," "lateral," and "vertical" etc., is used with reference to the orientation of the figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

The terms "electrical connection" and "electrically connected" describes an ohmic connection between two elements.

Figure 1A:
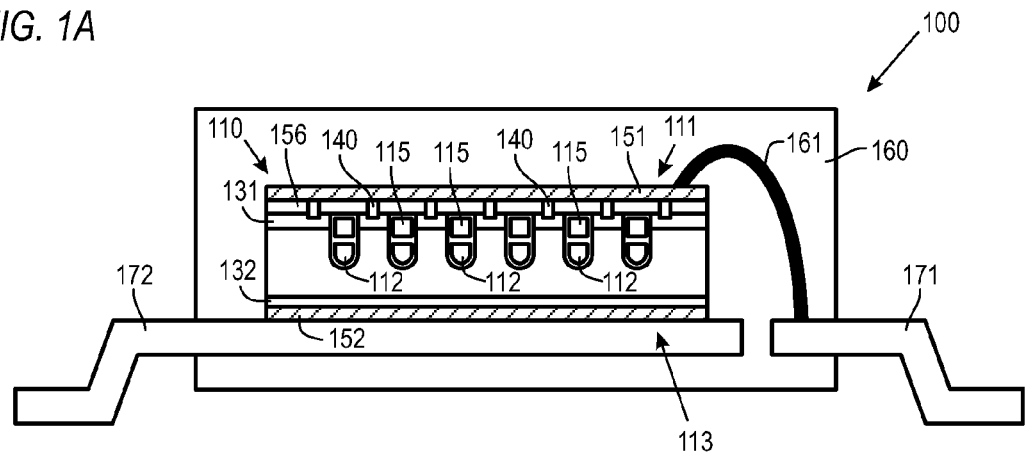
FIGS. 1A to 1C illustrate a power semiconductor package according to an embodiment.
Figure 1B:
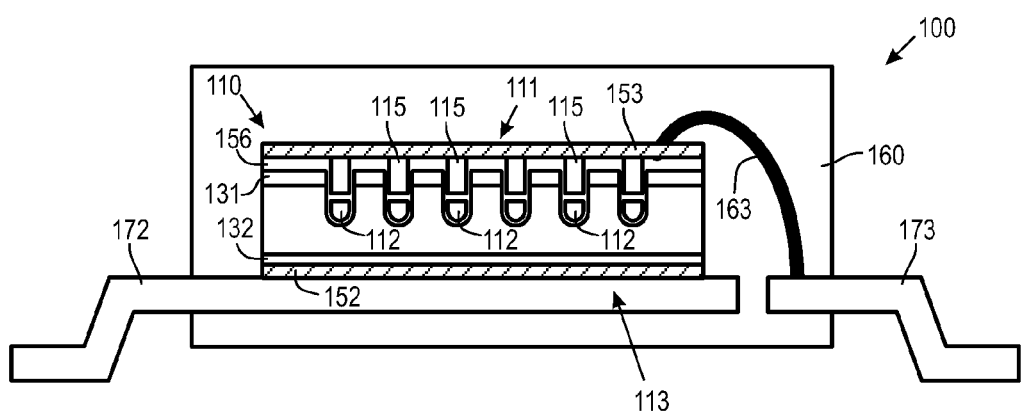
Figure 1C:
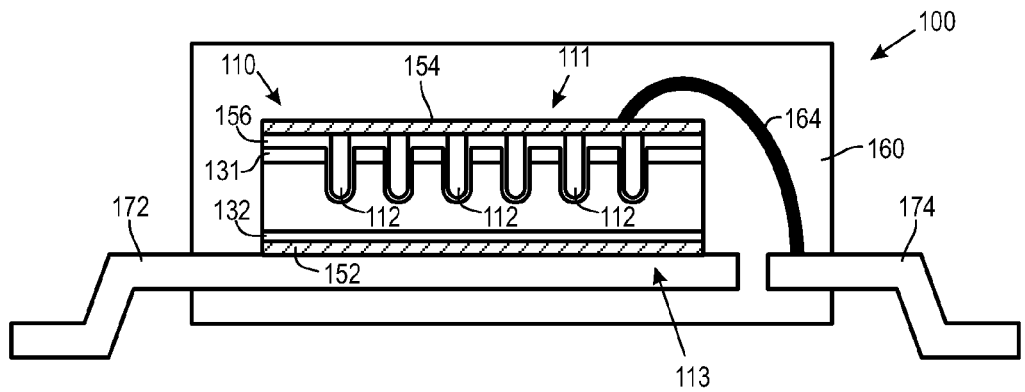

With reference to FIGS. 1A to 1C, a power semiconductor package 100 according to an embodiment is described. Each of the FIGS. 1A to 1C illustrates another vertical cross-section through the semiconductor package 100.

The semiconductor package 100 includes a housing 160 and a semiconductor chip 110 embedded in the housing 160. The semiconductor chip 110 includes a first doping region 131 in ohmic contact with a first metal layer 151 arranged on a first side 111 of the semiconductor chip 110. A second doping region 132 is in ohmic contact with a second metal layer 152 that is arranged on a second side 113 of the semiconductor chip 110 opposite the first side 111. In the embodiment shown in FIGS. 1A to 1C, the first semiconductor region 131 can be formed by an n-doped source region and a p-doped body region in direct electrical contact via the contact plugs 140 of a power FET and the first metal layer 151 a source metallization. The second doping region 132 can be an n-doped drain region of the power FET and the second metal layer 152 a drain metallization. In other embodiments, the first doping region 131 can be n-doped, the second doping region 132 can be a p-doped region, the first metal layer 151 an emitter metallization, and the second metal layer 152 a collector metallization of an IGBT.

An insulating layer 156 is arranged between the first metal layer 151 and the first doping region 131. The electrical contact between the first metal layer 151 and the first doping region 131 is provided by a plurality of plugs 140 extending through the insulating layer 156.

A plurality of first trenches is formed in the semiconductor chip 110. The first trenches include gate electrodes 115 and at least field electrodes 112 electrically insulated from the gate electrodes 115. Both the field electrodes 112 and the gate electrodes 115 are electrically insulated from the semiconductor material of the semiconductor chip 110 by dielectric layers which form respective gate dielectric layers and field dielectric layers. The gate dielectric layers can be made of an insulating material different from the insulating material of the field dielectric layers used to insulate the field electrodes 112. Furthermore, the thickness of the gate dielectric layers and the field dielectric layers, in lateral direction, can be different.

The semiconductor package 100 further includes at least four terminals 171, 172, 173, and 174 that are partially embedded in the housing 160 and are partially exposed to the outside of the housing 160. The terminals 171, 172, 173, 174 can be part of a common leadframe.

A first terminal 171 of the at least four terminals is electrically connected to the first metal layer 151, for example by a bond wire 161 as illustrated in FIG. 1A. A second terminal 172 of the at least four terminals is electrically connected to the second metal layer 152, for example by soldering.

As illustrated in FIG. 1B, a third terminal 173 of the at least four terminals is electrically connected the gate electrodes 115 of the first trenches, for example by a further bond wire 163 which connects the third terminal 173 with a third metal layer 153 arranged on the first side 111 of the semiconductor chip 110. The third metal layer 153 is electrically insulated from the first metal layer 151. The gate electrodes 115 extend through the insulating layer 156 to be in contact with the third metal layer 153 and to provide an electrical contact therewith. Alternatively, plugs similar to the plugs 140 can be formed in the insulating layer 156 to provide an electrical connection between the gate electrodes 115 and the third metal layer 153.

As illustrated in FIG. 1C, a fourth terminal 174 of the at least four terminals is electrically connected the field electrodes 112 of the first trenches. The field electrodes 112 can extend, in a cross-section different than the cross-section as illustrated in FIG. 1B, up to a fourth metal layer 154 arranged on the first side 111 of the semiconductor chip 110. Alternatively, plugs similar to the plugs 140 can be formed in the insulating layer 156 to provide an electrical contact between the field electrodes 112 and the fourth metal layer 154. A further bond wire 164 electrically connects the fourth metal layer 154 and thus the field electrodes 112 with the fourth terminal 174. Each of the first, third and fourth metal layers 151, 153, and 154 forms a respective metal pad on the first side 111 for bond wire connection. Alternatively to the bond wire, a clip or other connection techniques can be used to form the electrical contacts between the electrodes and the terminals.

As shown in FIGS. 1A to 1C, the field electrodes 112 are arranged below the gate electrodes 115. The gate electrodes 115, when the semiconductor package 100 is in use, are operably connected to a separate gate driver to be provided with a gate voltage to control the conductivity of a vertical channel.

According to an embodiment, the semiconductor chip 110 includes a plurality of trenches wherein some, most or all of these trenches can include a gate electrode 115 and at least one field electrode 112 electrically insulated from the respective gate electrode 115.

The trenches can be subdivided into separate groups, for example into a group of first trenches and a group of second trenches. The group of first trenches can be formed by the trenches, which in each case include a gate electrode 115 and at least one field electrode 112, wherein each of the gate electrodes 115 is electrically connected to the third terminal 173 and each of the field electrodes 112 is electrically connected to the fourth terminal 174. The group of second trenches can be formed by trenches, which differ from the group of first trenches either by having a different configuration and/or by being differently electrically connected. For example, the group of second trenches can be formed by the trenches, which in each case include a gate electrode 115 and at least one field electrode 112, wherein each of the gate electrodes 115 is electrically connected to the third terminal 173 while each of the field electrodes 112 is not electrically connected to the fourth terminal 174. In a further example, the group of second trenches can be formed by the trenches, which in each case include a gate electrode 115 and at least one field electrode 112, wherein each of the gate electrodes 115 is electrically connected to the third terminal 173 while each of the field electrodes 112 is electrically connected to the first doping region 131 or to another doping region.

In further embodiments, a group of third trenches can differ from the group of first trenches and the group of second trenches either by having a different configuration and/or by being differently electrically connected. For example, the group of the first trenches can be defined as above. The group of second trenches can be defined by trenches that in each case include a gate electrode 115 and at least one field electrode 112, wherein each of the gate electrodes 115 is electrically connected to the third terminal 173 while each of the field electrodes 112 is not electrically connected to the fourth terminal 174. The group of third trenches can be defined by trenches that in each case include a gate electrode 115 and at least one field electrode 112, wherein the gate electrodes 115 are not electrically connected to the third terminal 173 while each of the field electrodes 112 is electrically connected to the fourth terminal 174.

In an embodiment, all trenches have the same configuration, for example include gate electrodes and field electrodes, but differ in their electrical connection. The sub-groups of the trenches then differ from each other by the type of the electrical connection. It is, however, also possible that there is only one sub-group and that all field electrodes of all trenches are electrically connected to the fourth terminal 174.

Each sub-group of the trenches can thus be defined by trenches having, within the respective sub-group, the same configuration and having the same electrical connection. Thus, the semiconductor chip 110 can include one, two, three or more sub-groups of trenches X1, X2, X3, . . . etc. that together form the (all) trenches X of the semiconductor chip 110. For example, if all trenches, particularly all trenches in an active area of the semiconductor chip 110, include respective gate electrodes 115 and field electrodes 112, only some of the gate electrodes 115 can be electrically connected to the third terminal 173 and only some of the field electrodes 112 can be electrically connected to the fourth terminal 174. The number of the gate electrodes 115 that are electrically connected to the third terminal 173 and the number of the field electrodes 112 that are electrically connected to the fourth terminal 174 can be equal or different. In a specific example, most or all of gate electrodes 115 are electrically connected to the third terminal 173 and only few field electrodes 112 are electrically connected to the fourth terminal 174.

The trenches can have the same configuration but can be differently electrically connected thus defining different sub-groups. For example, the gate electrodes 115 of all trenches of a first sub-group are electrically connected to the third terminal 173 and the field electrodes 112 of all trenches of the first sub-group are electrically connected to the fourth terminal 174, and the gate electrodes 115 of all trenches of a second sub-group are electrically connected to the third terminal 173 while the field electrodes 112 of all trenches of the second sub-group are electrically disconnected to the fourth terminal 174 or electrically connected to a fifth terminal.

According to an embodiment, the trenches of each sub-group can be equally distributed throughout the active area, for example arranged in a periodic pattern, or randomly distributed. According to an embodiment, the trenches of at least one the sub-groups can be clustered in a given region, for example close to the periphery of the active area, or in regions where conductive structures such as so-called gate fingers are formed, while the trenches of another sub-group can be clustered in another region. For example, the arrangement of the sub-group of first trenches having their field electrodes connected to the fourth terminal in given regions allow to control the avalanche behavior of the semiconductor device specifically in those regions. It is thus, for example, possible to restrict the avalanche breakdown to specific regions of the semiconductor chip 110 while keeping other regions unaffected.

The housing 160 completely encapsulates and embeds the semiconductor chip 110 and the bond wires 161, 163, 164. The material of the housing 160, which can be an insulating molding material, provides sufficient dielectric insulation. For example, the material of the housing can be an organic molding material. In addition to the molding material, the semiconductor chip 110 can be encapsulated, or partially covered, by a passivation layer. Alternatively, the semiconductor chip 110 can at least partially be encapsulated in molding material or other isolating materials e.g. in case of chip embedding techniques.

The semiconductor chip 110 typically includes one discrete semiconductor device such as a power FET (field-effect transistor) or an IGBT (insulated gate bipolar device). Such devices include a plurality of substantially identical cells arranged in an active area of the semiconductor chip 110. A single cell is defined, for example, by the pitch of the trenches. The active area is laterally surrounded, when seen in a projection onto the first side 111, by an edge termination area which extends up to the outer rim or edge of the semiconductor chip 110. The edge termination area is not illustrated in detail in FIGS. 1A to 1C and is arranged between the active area defined by the first trenches and the outer lateral edges of the semiconductor chip 110. In the case of power ICs, additionally there can be further devices like temperature and/or current sensors or further MOSFET devices located on the first side 111. For electrical connection of such sensors, the semiconductor package can include at least a further terminal which can be referred to as sensor terminal.

The semiconductor packages as described herein are typically discrete power devices and do not include any driver logic or drive stage for driving the discrete device. Furthermore, each semiconductor package can include only one discrete semiconductor device unlike modules that include at least two power devices to form, for example, a half-bridge. The semiconductor package, however, can also include modules formed by discrete semiconductor devices, where for each of the discrete devices an additional terminal, which is in electrical connection with few, many or all field electrodes of the respective discrete device, is provided. It is also possible to provide a common terminal for the field electrodes of the discrete devices or a common terminal for a subgroup of discrete devices.

The semiconductor chip 110 can be made of any semiconductor material suitable for manufacturing semiconductor devices. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe). The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

Figure 2:
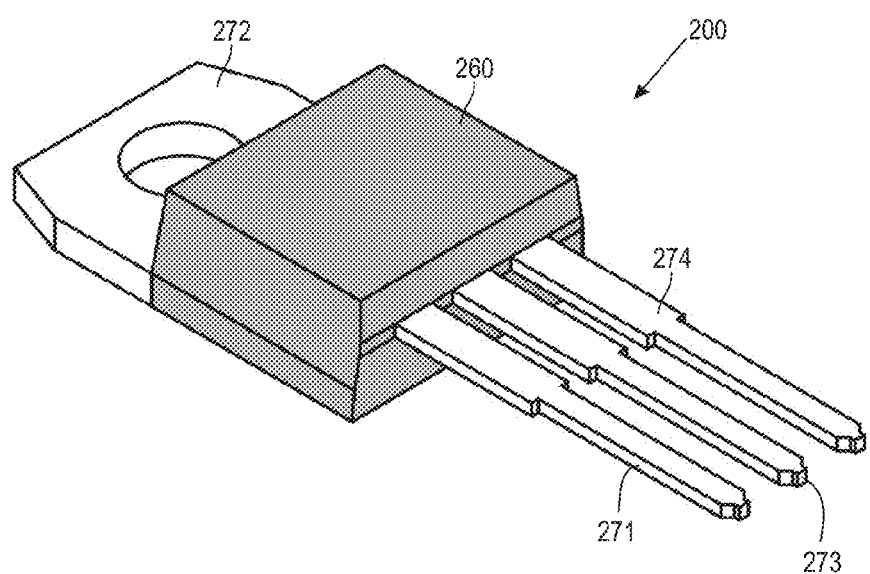
FIG. 2 illustrates a 3-dimensional view of a power semiconductor package according to an embodiment.

The semiconductor package can be provided in any suitable package outline which is commercially available. FIG. 2 illustrates, as an example, a semiconductor package 200 having an outline similar to JEDEC TO-220. FIG. 2 shows a modification of a TO-220 package. The package 200 is designed for being inserted with its leads 271, 272, 273 into through-holes of a PCB (printed circuit board). In addition, this semiconductor package 200 can be mounted to a heat-sink to dissipate heat. As illustrated in FIG. 2, the upper side of the semiconductor package 200 has a metal plate 272 which extends from the housing 260 and forms the second terminal 272 in the present embodiment. The metal plate 272 has a hole to mount the semiconductor package 200 to a heat-sink. The three leads 271, 273, 274 form the first, third and fourth terminals 271, 273, 274 of the semiconductor package 200.

Figure 3:
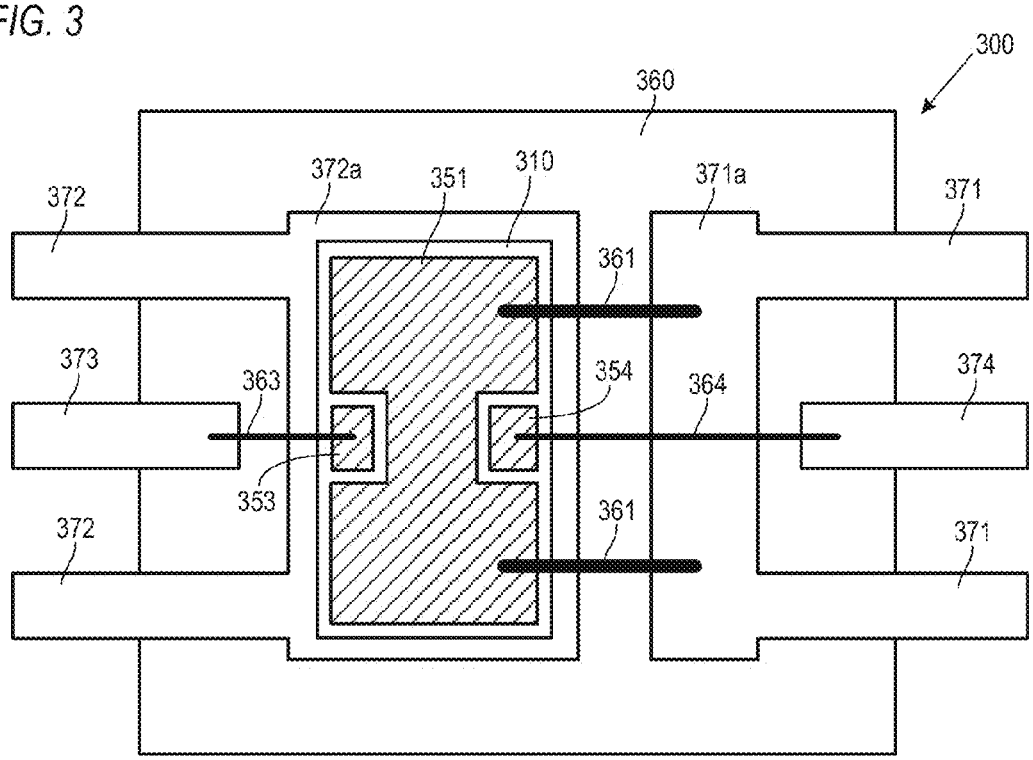
FIG. 3 illustrates a power semiconductor package according to another embodiment.

Another embodiment is illustrated in FIG. 3 and shows a six-lead package 300. However, the two leads 372 together form the second terminal 372 and the two leads 371 form together the first terminal 371 so that the semiconductor package 300 includes only four electrically distinguishable terminals. The third and fourth terminals 373 and 374, respectively, are each formed by a single lead. All terminals 371, 372, 373, 374 can be part of a single leadframe stamped out of a metal sheet. The two leads of the second terminal 372 are connected by a pad 372a onto which the semiconductor chip 310 is soldered with its backside or second side which is not visible in FIG. 3. On the upper side or first side of the semiconductor chip 310, which is visible in FIG. 3, the first metal layer 351, the third metal layer 353 and the fourth metal layer 354 are arranged and electrically insulated from each other. Each of the first, second and third metal layers 351, 353, and 354 forms a respective metal pad for a bond wire connection.

The first metal layer 351, which forms the source metallization in this embodiment, assumes a larger area than each of the third and fourth metal layers 353, 354. Two bond wires 361 are provided here to form the electrical connection between the first metal layer 351 and a bonding pad 371a which connects the two leads of the first terminal 371. The third metal layer 353 is electrically connected by a single bond wire 363 with the third terminal 373, and the fourth metal layer 354 is electrically connected by a single bond wire 364 with the fourth terminal 374. The bond wires 361 form a first bond connection, the bond wire 363 forms a second bond connection, and the bond wire 364 forms a third bond connection.

The terminals can include a "landing" pad onto which the bond wire is pressed to provide the electrical contact. The terminals are embedded in the housing at least with their landing pads so that the bond connection is completely covered and protected.

As illustrated in FIG. 3, the two bond wires 361 that connect the first terminal 371 with the first metal layer 351 can be thicker than the other bond wires 363, 364 to allow conduction of high currents. In addition or alternatively, the number of the bond wires 361 can be increased to provide a sufficiently large total cross-section of the electrical contact between the first metal layer 351 and the first terminal 371.

The semiconductor chip 310 and the bond wires 361, 363, 364 are completely embedded in the molding material of the housing 360. Furthermore, all "landing" pads of the terminals 371, 372, 373, 374 are completely embedded in the housing 360. The terminals 371, 372, 373, 374 are arranged to be exposed on opposite sides of the package 300. In other embodiments, the terminals can be exposed to the underside of the package or to only one side of the package.

Referring to FIG. 4, a semiconductor chip 400 of a semiconductor package according to an embodiment is depicted. The semiconductor chip 400 includes a semiconductor substrate 405 that can be made of silicon, silicon carbide, III-V semiconductor material, or any other suitable semiconductor material. The term semiconductor chip as used herein refers to a semiconductor die after cutting a wafer, in which a plurality of separate semiconductor device is formed.

The semiconductor substrate 405 can include a single crystal material and at least one epitaxial layer formed thereon. Alternatively, the semiconductor substrate 405 can be formed from a wafer without any additional epitaxial layer or from a wafer formed by bonding two wafers with an optional epitaxial deposition.

The semiconductor substrate 405 includes a first surface or side 411 and a second surface or side 402 arranged opposite the first surface 411.

A first doping region 431 is arranged in the semiconductor substrate 405 at the first surface or side 411. The first doping region 431 typically serves as source region and is of a first conductivity type. In many applications, the first region 431 is highly n-doped. In the following description, the first doping region 431 is referred to as source region 431 without being limited thereto.

At the second surface or side 402 a second doping region 432 is formed in the semiconductor substrate 405. In the case of a FET-transistor, the second doping region 432 is a drain region having the same conductivity type as the source region 431. Contrary thereto, in the case of an IGBT, the second doping region 432 forms an emitter region that is of opposite conductivity to that of the source region 431. In the following description, the second doping region 432 is referred to as drain region 432 without being limited thereto.

A third doping region 433 is arranged in the semiconductor substrate 405 in contact with the source region 431. The third doping region 433 typically forms a body region and has a conductivity type opposite to that of the source region 431 so that a pn-junction is formed between the source region 431 and the third doping region 433. In the following description, the third doping region 433 is referred to as body region 433 without being limited thereto.

A fourth doping region 434 is arranged between the body region 433 and the drain region 432 and typically forms a drift region having the same conductivity type as the source region 431. The doping concentration of the fourth doping region 434 substantially corresponds to the background doping concentration of the semiconductor substrate 405 or of the epitaxial layer if one is used. However, the doping concentration of the fourth doping region 434 can also exhibit a doping profile having a maximum or a minimum at a desired location or an increasing or decreasing doping concentration in vertical direction. The fourth doping region 434 forms with the body region 433 a pn-junction 437. In the following description, the fourth doping region 434 is referred to as drift region 434 without being limited thereto.

An optional field-stop region 435 having the same conductivity as the drift region 434 but being higher doped than the drift region 434 can be arranged between the drift region 434 and the drain region 432.

A plurality of first trenches 410 is formed in the semiconductor substrate 405 and extends from the first surface 411 into the semiconductor substrate 405 towards the second surface 402 with the bottom of the first trenches 410 being spaced from the drain region 432. Furthermore, a plurality of second trenches 420 that generally have the same arrangement as the first trenches 410 is also formed in the semiconductor substrate 405.

In some embodiments, the semiconductor chip 400 includes first and second trenches 410, 420 in alternating arrangement. In other embodiments, the semiconductor chip 400 includes an arrangement where two first trenches 410 alternate with a single second trench 420, or where five first trenches 410 alternate with a single second trench 420. When considering all first and second trenches 410, 420 as the trenches of the semiconductor chip 400, the second trenches 420 can be formed by every nth trench of the semiconductor chip 400, with n being at least two or more. Examples for n are 3, 5, 10 or 20. The arrangement of the second trenches 420 can be periodically, but also in random manner.

In the embodiment illustrated in FIG. 4, the first and second trenches 410, 420 have a substantially identical arrangement. Therefore, the following description refers to the first and second trenches 410, 420 equally. Each of the first and second trenches 410, 420 includes a gate electrode 415, 425 and a field electrode 412, 422, with the gate electrode 415, 425 being arranged above the field electrode 412, 422 in proximity to the first surface 411. The gate electrodes 415, 425 extend vertically, i.e. parallel to the vertical extension of the first and second trenches 410, 420, from the source region 431 to the drift region 434. Since the body region 433 is arranged between the source region 431 and the drift region 434, the gate electrodes 415, 425 of the first and second trenches 410, 420 extend completely through the body region 433.

Gate electrodes 415, 425 and/or field electrodes 412, 422 can be formed of polysilicon or any other suitable conductive material.

Gate dielectric layers 413, 423, sometimes referred to as gate oxide layers (GOX), are arranged between the gate electrodes 415, 425 and the semiconductor substrate 405 and particularly between the gate electrodes 415, 425 and the body region 433.

Field dielectric layers 414, 424, typically field oxides (FOX), are arranged between the field electrodes 412, 422 and the semiconductor substrate 405, particularly between the field electrodes 412, 422 and the drift region 434, and insulate the field electrodes 412, 422 from the drift region 434. The field dielectric layers 414, 424 have a significantly greater thickness in comparison with the gate dielectric layers 413, 423 to withstand high electrical field strengths occurring during operation of the semiconductor device and to avoid electrical breakdown between the field electrodes 412, 422 and the drift region 434.

The gate electrodes 415, 425 and field electrodes 412, 422 are different from each other and serve different purposes. The gate electrodes 415, 425 are arranged close to the body region 433 to control the conductivity of respective channel regions that extend from the source region 431 to the drift region 433 along the gate dielectric layers 413, 423. Different thereto, the field electrodes 414, 424 are arranged close to the drift region 434 to influence the distribution of the electrical field in the drift region 434 or to provide compensation charges for depleting the drift region 434 in a blocking state.

The first and second trenches 410, 420 can define respective separate cells of the semiconductor device which are electrically connected in parallel to each other to increase the available cross-section for the load current and to reduce the on-state resistance.

Contact regions 440 are formed in the semiconductor substrate 405 at the first surface 411 between adjacent trenches 410, 420. Typically, each contact region 440 is a groove filled with a highly conductive material.

A first metal layer 451, as described above, is arranged on the first side or surface 411 of the semiconductor substrate 405, and a second metal layer 452 is arranged on the second side or surface 402 of the semiconductor substrate 405. The first metal layer 451, which forms here the source metallization, is electrically insulated from the semiconductor substrate 405 by an insulating layer 456 having openings only in regions where the contact regions 440 are formed to allow electrical connection to the source region 431 and the body region 433. Alternatively, conductive plugs extending through the insulating layer 456 can be provided.

The gate electrodes 415, 425 of the first and second trenches 410, 420 are electrically connected to the third terminal as described above so that the conductivity of all channel regions adjacent to the first and second trenches 410, 420 are commonly controlled.

Some field electrodes 412 or each field electrode 412 of the first trenches 410 are/is electrically connected to the fourth terminal as described above. Different thereto, some field electrodes 422 or each field electrode 422 of the second trenches 420 are/is electrically connected to a fifth terminal that is partially embedded in the housing and exposed to the outside of the housing, as described above in connection with the other terminals. Hence, the field electrodes 412, 422 of the first and second trenches 410, 420 can be operated at different electrical potentials during operation. Furthermore, the supplied voltage can be changed during operation depending on circumstances to provide the semiconductor device such as the FET with dynamically varying electrical properties. The semiconductor package thus includes in this embodiment at least five electrically distinguishable terminals.

Figure 7:
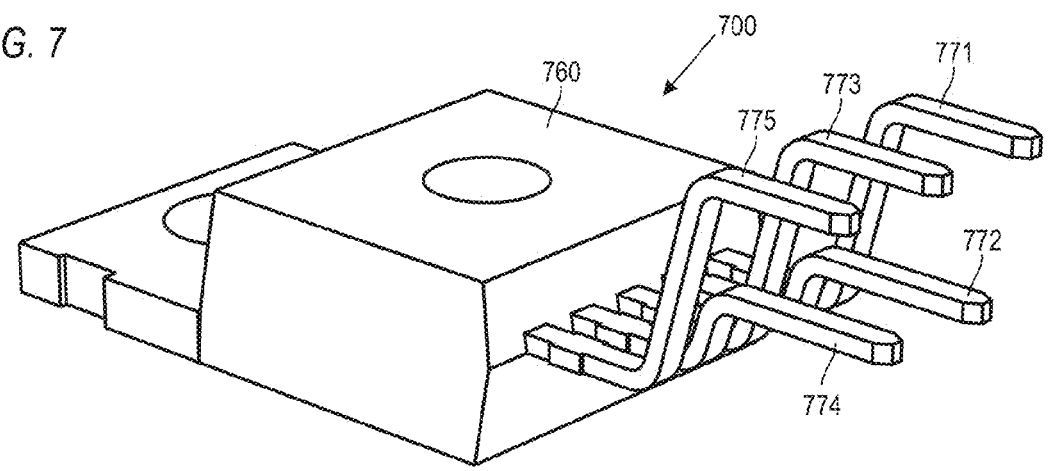
FIG. 7 illustrates a 3-dimensional view of a power semiconductor package according to an embodiment.

An example of a semiconductor package 700 having at least five terminals is illustrated in FIG. 7. This semiconductor package 700 has an outline according to JEDEC TO-220-5-3 and includes first to fifth terminals 771, 772, 773, 774, 775 exposing from a side of the housing 760. The semiconductor package can also be embodied in any other available package outline.

Alternatively, some field electrodes 422 or each field electrode 422 of the second trenches 420 can be electrically connected to the first metal layer 451 or directly to the source region 431 while some field electrodes 412 or each field electrode 412 of the first trenches 410 remain or remains electrically connected to the fourth terminal. In this embodiment, only the field electrodes 412 of the first trenches 410 can be electrically controlled independently from the source region 431 while the electrical potential of the field electrodes 422 of the second trenches 420 follows the electrical potential applied to the source region 431.

In an alternative embodiment, some second trenches 420 or each second trench 420 include or includes a gate electrode 425 but no field electrode, wherein some gate electrodes 425 or each gate electrode 425 of the second trenches 420 are or is electrically connected to the third terminal.

With respect to FIG. 5, a semiconductor chip 500 used in a semiconductor package according to a further embodiment is described. The semiconductor chip 500 also includes a semiconductor substrate 505 having a first and a second surface as described above. Furthermore, the semiconductor chip 500 includes a first doping region 531 which forms in this embodiment the source region, a second doping region 532 which forms in this embodiment the drain region, a third doping region 533 which forms in this embodiment the body region, a fourth doping region 534 which forms in this embodiment the drift region, and an optional field-stop region 535. The first to fifth regions 531, 532, 533, 534, 535 can be formed and doped as described above.

An insulating layer 556 is formed on the first side or surface of the semiconductor substrate 505 to insulate a first metal layer 551 from the semiconductor substrate 505. Conductive plugs 540 extend through the insulating layer 556 and reach up to the body region 533 to electrically connect the body region 533 and the source region 531 with the first metal layer 551, which forms here the source metallization.

A second metal layer 552, which forms the drain metallization, is arranged on the second side of the semiconductor chip 500 and in electrical connection with the drain region 532.

The semiconductor chip 500 includes a plurality of first trenches 510 including a gate electrode 515 as described above. Different to the embodiment illustrated in FIG. 4, each first trench 510 includes two field electrodes 512a, 512b. A first field electrode 512a is arranged directly below the gate electrode 515, and a second field electrode 512b is arranged directly below the first field electrode 512a. The first and second field electrodes 512a, 512b and the gate electrodes 515 are electrically insulated from each other.

Each of the gate electrodes 515 is electrically connected to the third terminal as described above. Furthermore, each of the first field electrodes 512*a* is electrically connected to the fourth terminal through a fourth metal layer formed on the semiconductor chip 500 as described above. Each of the second field electrodes 512*b* is electrically connected, through a fifth metal layer which can be formed on the first side of the semiconductor chip 500, to a fifth terminal. This arrangement allows separate control of the gate electrodes 515 and the first and second field electrodes 512*a*, 512*b*.

In a further embodiment, all or only some of the first field electrode 512*a* can be electrically connected to the source region 531 while the second field electrodes 512*b* are electrically connected to an external terminal such as the fourth terminal.

In another embodiment, some of the first field electrodes 512*a* are electrically connected to the drain region 531 while the other first field electrodes 512*a* are electrically insulated from the source region 531 and are electrically connected to the fourth terminal. The second field electrodes 512*b* can be electrically connected to the fifth terminal.

It is also possible to combine the embodiments shown in FIGS. 4 and 5 to have first, second and third trenches where the respective first and/or second field electrodes are connected to separate external terminals.

The semiconductor chip 500 can be integrated into a five-leads package 700, as for example illustrated in FIG. 7.

Figure 6:
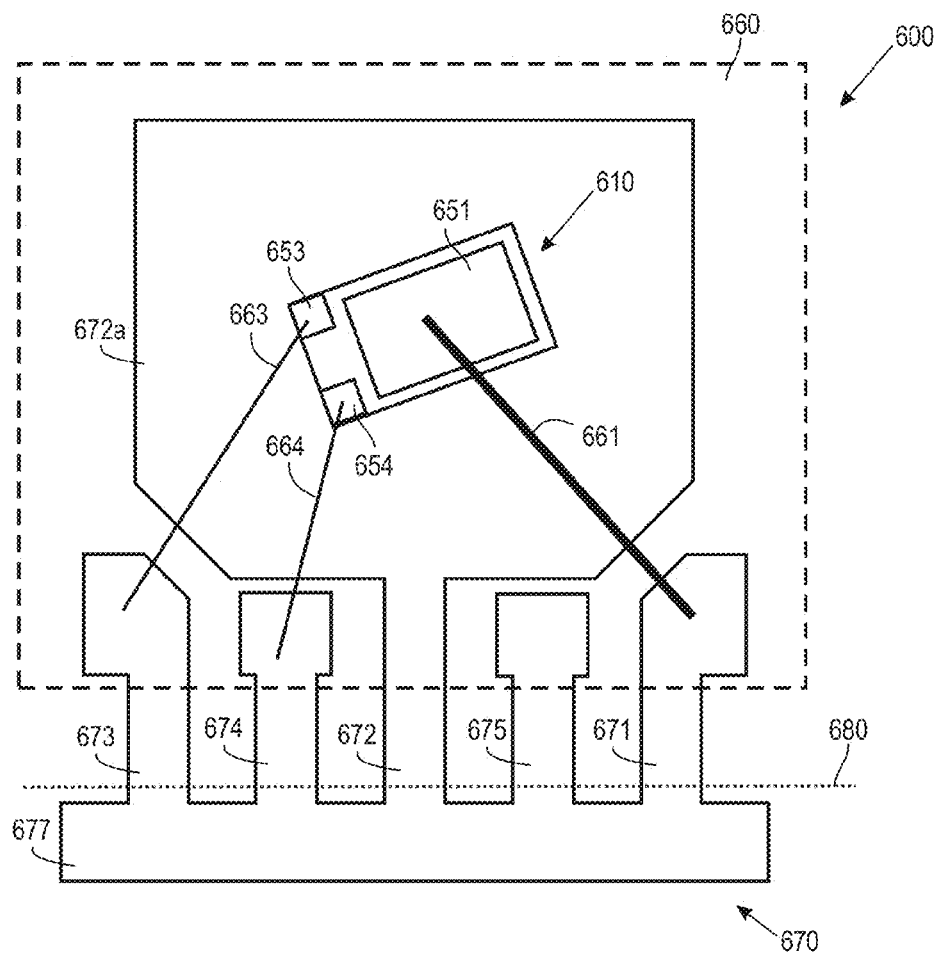
FIG. 6 illustrates a power semiconductor package according to another embodiment.

With reference to FIG. 6, a further embodiment is described that illustrates the bonding scheme of a semiconductor chip 610 in a housing 660 provided with five leads 671, 672, 673, 674, 675. The five leads 671, 672, 673, 674, 675 are part of a common lead frame 670 and are still connected by a metal bar 677. After the semiconductor chip 610 is completely embedded in the housing 660, the outline of which is indicated by a dashed line, the leads are disconnected from each other by cutting-off the metal bar 677, for example along the dotted line 680.

The first metal layer 651 of the semiconductor chip 610 is electrically connected to a landing pad of the first terminal 671 by a single thick bond wire 661. The second metal layer, which is formed on the underside of the semiconductor chip 610 and thus not visible in FIG. 6, is soldered to a large pad 672*a* of the second terminal 672. The third metal layer 653 is electrically connected to a landing pad of the third terminal 673 by a single bond wire 663, and the fourth metal layer 654 is electrically connected to a landing pad of the fourth terminal 674 by a single bond wire 664. All landing pads of the terminals 671, 673, 674 and the large pad of the second terminal 673 are completely encapsulated by the housing 660.

The fifth terminal 675 is not electrically connected to any metal layer of the semiconductor chip 610 and thus electrically inactive. It is, however, also possible to connect the fifth terminal 675 with the first metal layer 651 by a further bond wire to increase the area of electrical connection and thus reduce the resistance.

Figure 8:
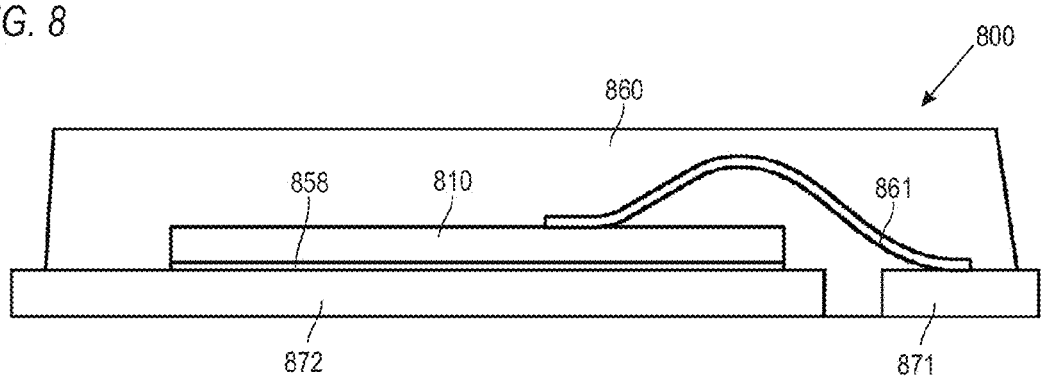
FIG. 8 illustrates a power semiconductor package according to an embodiment.
Figure 9:
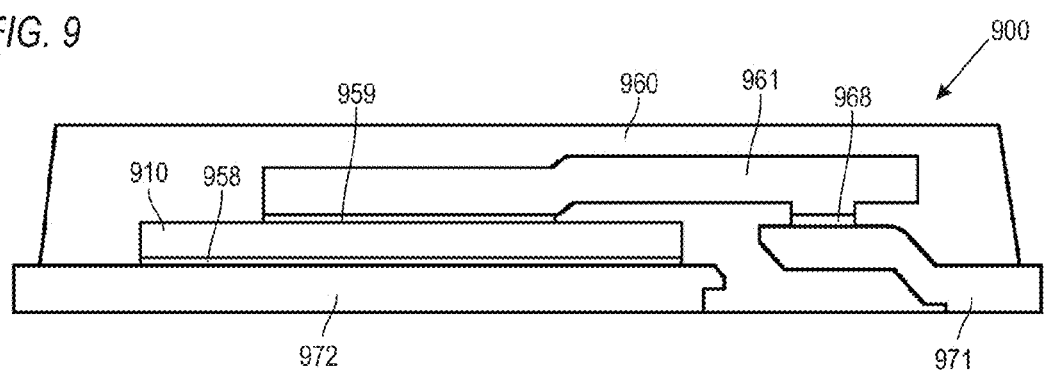
FIG. 9 illustrates a power semiconductor package according to another embodiment.

FIGS. 8 and 9 illustrate further semiconductor packages 800 and 900 that are embodied to have a package outline similar to JEDEC MO-240, which is also referred to as Super-SO8. These packages are leadless packages using lands on the bottom of the package to provide electrical and thermal contact to a printed circuit board to which the package is surface soldered. The lands form the terminals as described above.

In FIG. 8, the metal layers or pads formed on the upper side of the semiconductor chip 810 are bonded by bond wires to the respective terminals or lands. FIG. 8 shows only the first terminal 871. The upper side of the first terminal 871 forms the landing pad for the bond wires 861. The lower side and the outer side of the first terminal 871 are exposed while the other sides including the landing pad side are completely encapsulated by the molding material of the housing 860. The second terminal 872 formed by a large land is arranged below the chip 810 that is soldered with its lower side to the upper side of the second terminal 872. The solder layer is indicated at 858. Soldering can be done by any type of soldering. The underside of the second terminal 872 is exposed to provide a large soldering and thermal contact.

As described above, the power semiconductor package can include a first bond connection that electrically connects the first metal layer forming, for example, the source metallization with the first terminal, wherein the bond wire is embedded in the housing. In an embodiment that can be combined with any other embodiment described herein the gate metallization, for example formed by the third metal layer 153, which is in ohmic contact with some or each gate electrode 115, 515, 525 of the first and or second trenches 410, 420, can be electrically connected to the third terminal 173 by the bond wire 163 forming a second bond connection, which is embedded in the housing.

In an embodiment that can be combined with any other embodiment described herein a first field electrode metallization that can be formed by the fourth metal layer 154 and is in ohmic contact with some or each field electrode 112, 412 of the first trenches 410, can be electrically connected to the fourth terminal 174 by the bond wire 174 forming a third bond connection which is embedded in the housing.

Different thereto, the second metal layer 152 can be soldered to the second terminal 172 as illustrated in the above figures.

While the embodiment of FIG. 8, as well as of FIGS. 1A to 1C, for example, show a wire bond connection between the first, third and fourth terminals and the semiconductor chip, FIG. 9 illustrates the same package outline as illustrated in FIG. 8 but employing a clip bond.

The semiconductor chip 910 is also soldered with its second metal layer formed on the underside of the semiconductor chip 910 to the second terminal 972. The soldering layer is indicated at 958.

Different to FIG. 8, at least the source metallization formed by the first metal layer is soldered to a clip 961 which can be a copper bond. The clip 961 is soldered at 968 to the first terminal 971.

Alternatively, the first terminal 971 can include a die attachment pad, wherein the first metal layer (source metallization) of the semiconductor chip 910 is soldered to the die attachment pad. Furthermore, a metal clip can be soldered to the second metal layer, wherein the second terminal comprises a connection pad which is electrically connected to the metal clip. In this case, the terminal 972 forms the first terminal while terminal 971 forms the second terminal.

The embodiment of FIG. 9 exhibits a lower package resistance due to the copper clip connection.

As described above in detail with respect to all embodiments, a power semiconductor package for a FET includes in addition to the usual terminals or pin outs for source, drain and gate a further electrically distinguishable terminal or pin out which is in electrical contact with the field electrodes formed in the trenches of the FET. The additional terminal allows a supply of a voltage to the field electrodes independently from the source voltage. In addition, the voltage externally supplied to the field electrodes can be freely varied. The additional terminal is also referred to as "tuning pin" or "performance tuning pin".

The semiconductor packages as described herein allow a fast switching of the discrete semiconductor device such as FET embedded in the semiconductor package since the field electrodes can be charged and discharge independently of the source voltage. Moreover, the parameter R(DS)on*A (on-state resistance times available area for current conduction) can be decreased by about 10-20% when appropriately controlling the voltage supplied to the field electrodes. This significantly reduces the losses of the device. Hence, the freely externally controllable field electrodes (by using the above mentioned "performance tuning pin") allow a high flexibility for adapting the dynamical electrical characteristics of the semiconductor device embedded in the package such as reduction of the on-state losses or the switching speed which can be controlled, for example, by adapting Qgd (charge of the gate-drain capacitance). Furthermore, a temporal variation or optimization of the device parameters is possible depending on the specific application so that the same device can be differently operated for different applications.

The above mentioned fourth terminal that is in electrical contact with the at least one field electrode in the trench may be called "tuning terminal" or "tuning PIN" or "performance terminal" or "performance PIN" or "performance tuning PIN". This means, that the performance of the power MOSFET can be tuned by applying a predefined electrical potentials to this terminal. For example, for an n-channel power MOSFET, applying a positive voltage in the typical range of +1 ... +20V leads to an improvement of the R(DS)on of the power devices by up 1 ... 30%. So the R(DS)on performance can be directly tuned by this applied voltage. In the same manner, the breakdown characteristics/regimes can be tuned or changed, e.g. the breakdown location may be changed from trench bottom regime to the pn-junction near the source-body plug.

According to an embodiment, the fourth terminal can be in direct electrical contact with the field electrodes of at least 20% of the trenches in the active area of the power MOSFET for tuning the performance parameters like R(DS)on, threshold voltages or leakage currents.

According to an embodiment, the edge termination area has a given area and includes at least one termination structure such as a field ring assuming a portion of the area of the edge termination area. A fifth terminal can be in direct electrical contact with at least one termination structure. The at least one termination structure can assume at least 20% of the edge termination area of the semiconductor chip. Furthermore, the fifth terminal can be electrically connected with at least one potential ring of the power MOSFET arranged in the edge termination area, e.g. for tuning the chip termination breakdown characteristic/regimes. The termination structure is typically not in electrical, i.e. ohmic, contact with any of the field electrodes in the active area. In modifications of embodiments, the termination structure is electrically connected to few of the field electrodes in the active area.

Spatially relative terms such as "under," "below," "lower," "over," "upper," "above" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor package, comprising:
   a housing;
   a semiconductor chip at least partially embedded in the housing, the semiconductor chip comprising a first doping region in ohmic contact with a first metal layer, a second doping region in ohmic contact with a second metal layer, and at least a. plurality of first trenches formed in the semiconductor chip, wherein the first trenches comprise gate electrodes and at least first field electrodes electrically insulated from the gate electrodes; and
   at least four terminals partially embedded in the housing and partially exposed to the outside of the housing, wherein
      a first terminal of the at least four terminals is electrically connected to the first metal layer,
      a second terminal of the at least four terminals is electrically connected to the second metal layer,
      a third terminal of the at least four terminals is electrically connected to the gate electrodes of the first trenches, and
      a fourth terminal of the at least four terminals is electrically connected to the first field electrodes of the first trenches.

2. The power semiconductor package of claim 1, wherein the first metal layer is arranged on a first side of the semiconductor chip, and the second metal layer is arranged on a second side of the semiconductor chip arranged opposite the first side of the semiconductor chip.

3. The power semiconductor package of claim 1, further comprising
   a plurality of second trenches formed in the semiconductor chip, wherein the second trenches comprise gate electrodes and at least field electrodes electrically insulated from the gate electrodes of the second trenches, wherein the gate electrodes of the second trenches are electrically connected with the third terminal; and
   a fifth terminal partially embedded in the housing and exposed to the outside of the housing, wherein the fifth terminal is electrically connected to the field electrodes of the second trenches.

4. The power semiconductor package of claim 1, wherein the first trenches comprise at least second field electrodes electrically insulated from the gate electrodes and the first field electrodes, wherein the power semiconductor package further comprises:
   a fifth terminal partially embedded in the housing and exposed to the outside of the housing, wherein the fifth terminal is electrically connected to the second field electrodes of the first trenches.

5. The power semiconductor package of claim 1, further comprising
   a plurality of second trenches formed in the semiconductor chip, wherein the second trenches comprise gate electrodes without field electrodes, and wherein the gate electrodes of the second trenches are electrically connected to the third terminal.

6. The power semiconductor package of claim 1, further comprising
a plurality of second trenches formed in the semiconductor chip, wherein the second trenches comprise gate electrodes and at least field electrodes, and wherein the gate electrodes of the second trenches are electrically connected to the third terminal, and the field electrodes of the second trenches are electrically connected to the first doping region.

7. The power semiconductor package of claim 1, further comprising a first bond connection comprising at least one bond wire that electrically connects the first metal layer with the first terminal, wherein the bond wire is embedded in the housing.

8. The power semiconductor package of claim 1, further comprising:
a gate metallization in ohmic contact with the gate electrodes of the first trenches; and
a second bond connection comprising at least one bond wire that electrically connects the gate metallization with the third terminal, wherein the bond wire is embedded in the housing.

9. The power semiconductor package of claim 1, further comprising:
a first field electrode metallization in ohmic contact with the field electrode of the first trenches; and
a third bond connection comprising at least one bond wire that electrically connects the first field electrode metallization with the fourth terminal, wherein the bond wire is embedded in the housing.

10. The power semiconductor package of claim 1, wherein the second metal layer is soldered to the second terminal.

11. The power semiconductor package of claim 1, wherein the first terminal comprises a die attachment pad, and wherein the first metal layer is soldered to the die attachment pad.

12. The power semiconductor package of claim 11, further comprising a metal clip soldered to the first metal layer, wherein the first terminal comprises a connection pad that is electrically connected to the metal clip.

13. The power semiconductor package of claim 1, wherein the housing is made of an organic molding material.

14. The power semiconductor package of claim 1, wherein the first doping region of the semiconductor chip forms a source region of a FET and the second doping region of the semiconductor chip forms a drain region of the FET, wherein the semiconductor chip further comprises a body region which is complementary doped to the source region.

15. A power semiconductor package, comprising:
a housing;
a semiconductor chip embedded in the housing, the semiconductor chip comprising a first doping region in ohmic contact with a first metal layer arranged on a first side of the semiconductor chip, a second doping region in ohmic contact with a second metal layer arranged on a second side of the semiconductor chip that is opposite the first side, and a plurality of trenches formed in the semiconductor chip, wherein the trenches comprise gate electrodes and at least first field electrodes electrically insulated from the gate electrodes; and
at least four terminals partially embedded in the housing and partially exposed to the outside of the housing, wherein a first terminal of the at least four terminals is electrically connected to the first metal layer,
a second terminal of the at least four terminals is electrically connected to the second metal layer,
a third terminal of the at least four terminals is electrically connected to the gate electrodes of the trenches, and
a fourth terminal of the at least four terminals is electrically connected to the first field electrode of every nth numbered trench of the trenches, and electrically insulated from the first field electrodes of the other trenches, wherein n is equal to or larger than 2.

16. The power semiconductor package of claim 15, further comprising
a fifth terminal partially embedded in the housing and exposed to the outside of the housing, wherein the fifth terminal is electrically connected to at least some of the first field electrodes of the trenches that are electrically insulated from the fourth terminal.

17. The power semiconductor package of claim 15, wherein at least some of the first field electrodes of the trenches that are electrically insulated from the fourth terminal are electrically connected to the first doping region.

18. The power semiconductor package of claim 15, wherein the first doping region forms a source region and a second doping region forms a drain region, the semiconductor chip further comprising:
a body region that is complementary doped to the source region, and a drift region of the same conductivity type as the source region and arranged between the body region and the drain region, wherein the trenches extends from the first side to the drift region.

19. The power semiconductor package of claim 15, wherein n is equal to or larger than 3.

20. The power semiconductor package of claim 15, wherein the semiconductor chip further comprises:
an active area, an outer rim and an edge termination area arranged between the active area and the outer rim; and
a termination structure arranged in the edge termination area, wherein the termination structure comprises at least one of a doping region, a field electrode and a potential ring;
wherein the semiconductor package includes a fifth terminal partially embedded in the housing and partially exposed to the outside of the housing, wherein the fifth terminal is electrically connected to the termination structure.

21. The power semiconductor package of claim 1, wherein the first doping region is a source or emitter region of a power FET, wherein the second doping region is a drain or collector region of a power FET, and wherein the first field electrodes of the first trenches and the fourth terminal are electrically independent from the first doping region and the second doping region.

22. The power semiconductor package of claim 15, wherein the first doping region is a source or emitter region of a power FET, wherein the second doping region is a drain or collector region of a power FET, and wherein the first field electrode of every nth numbered trench and the fourth terminal are electrically independent from the first doping region and the second doping region.

* * * * *